(12) United States Patent
Lee

(10) Patent No.: US 9,197,078 B2
(45) Date of Patent: *Nov. 24, 2015

(54) BATTERY PARAMETER ESTIMATION

(71) Applicant: Ford Global Technologies, LLC, Dearborn, MI (US)

(72) Inventor: Tae-Kyung Lee, Ann Arbor, MI (US)

(73) Assignee: Ford Global Technologies, LLC, Dearborn, MI (US)

( * ) Notice: Subject to any disclaimer, the term of this patent is extended or adjusted under 35 U.S.C. 154(b) by 25 days.

This patent is subject to a terminal disclaimer.

(21) Appl. No.: 14/132,046

(22) Filed: Dec. 18, 2013

(65) Prior Publication Data

US 2015/0171640 A1    Jun. 18, 2015

(51) Int. Cl.

| H01J 7/00 | (2006.01) |
|---|---|
| G01N 27/416 | (2006.01) |
| G01R 15/00 | (2006.01) |
| G01R 21/00 | (2006.01) |
| G01R 31/36 | (2006.01) |
| G01R 19/00 | (2006.01) |
| G01R 27/00 | (2006.01) |
| H02J 7/00 | (2006.01) |
| B60L 11/18 | (2006.01) |

(52) U.S. Cl.
CPC ........... *H02J 7/0013* (2013.01); *B60L 11/1809* (2013.01); *G01R 31/3606* (2013.01); *G01R 31/3662* (2013.01)

(58) Field of Classification Search
CPC .. G01R 31/36; G01R 31/3606; G01R 31/362; G01R 31/3624; B60R 16/033
USPC .................. 320/109, 132; 324/429, 430, 434; 702/57, 60, 63–65
See application file for complete search history.

(56) References Cited

U.S. PATENT DOCUMENTS

| 6,167,349 | A * | 12/2000 | Alvarez ............... G01R 31/362 324/430 |
|---|---|---|---|
| 7,764,049 | B2 | 7/2010 | Iwane et al. |
| 8,032,316 | B2 | 10/2011 | Rocci et al. |
| 2003/0184307 | A1 | 10/2003 | Kozlowski et al. |
| 2006/0111870 | A1* | 5/2006 | Plett .................. G01R 31/3651 702/181 |

(Continued)

FOREIGN PATENT DOCUMENTS

DE    102010003422 A1    10/2011

OTHER PUBLICATIONS

Kim et al, (State-of-Charge Estimation and State-of-Health Prediction of a Li-Ion Degraded Battery Based on an EKF Combined with a Per-Unit System),Nov. 2011,IEEE Transactions on Vehicular Technology, vol. 60, No. 9.*

(Continued)

*Primary Examiner* — Richard Isla Rodas
*Assistant Examiner* — Mohammed Jameel Sharief
(74) *Attorney, Agent, or Firm* — David B. Kelley; Brooks Kushman P.C.

(57) ABSTRACT

A vehicle includes a battery pack and at least one controller programmed to implement a model of the battery pack. The model includes parameters representing an internal resistance and charge transfer impedance of the battery pack, and identified from an extended Kalman filter having an augmented state vector. The augmented state vector is at least partially defined by a time constant associated with the charge transfer impedance and a variable representing a proportionality between the internal resistance and a resistance term of the charge transfer impedance to reduce observed variability of the parameters.

12 Claims, 4 Drawing Sheets

(56) References Cited

U.S. PATENT DOCUMENTS

2013/0110429 A1* 5/2013 Mitsuyama et al. ............ 702/63
2014/0214268 A1* 7/2014 Li et al. ........................ 701/34.4
2014/0309911 A1* 10/2014 Le et al. ........................ 701/112
2015/0064510 A1* 3/2015 Wang et al. ..................... 429/50

OTHER PUBLICATIONS

Plett, Extended Kalman filtering for battery management systems of LiPB-based HEV battery packs,Feb. 2004,Journal of Power Sources.*

State-of-Charge Estimation and State-of-Health Prediction of a Li-Ion Degraded Battery Based on an EKF Combined with a Per-Unit System; Nov. 2011, The IEEE Publication by Kim et al.,vol. 60.*

C.R. Gould et al., Novel Battery of an All-Electric Personal Rapid Transit Vehicle to Determine State-of-Health through Subspace Parameter Estimation and a Kalman Estimator, International Symposium on Power Electronics, Electrical Drives, Automation and Motion (2008) pp. 1217-1222, University of Sheffield, UK.

C. Zhang et al., Estimation of State of Charge of Lithium-Ion Batteries Used in HEV Using Robust Extended Kalman Filtering, Energies (2012) pp. 1098-1115, MDPI, Basel, Switzerland.

* cited by examiner

BATTERY PARAMETER ESTIMATION

TECHNICAL FIELD

The present disclosure relates to a battery management method and system which are capable of estimating parameters of elements forming a battery for providing control to the battery.

BACKGROUND

Hybrid electric vehicles (HEV) utilize a combination of an internal combustion engine with an electric motor to provide the power needed to propel a vehicle. This arrangement provides improved fuel economy over a vehicle that has only an internal combustion engine. One method of improving the fuel economy in an HEV is to shutdown the engine during times that the engine operates inefficiently, and is not otherwise needed to propel the vehicle. In these situations, the electric motor coupled with a battery system is used to provide all of the power needed to propel the vehicle. When the driver power demand increases such that the electric motor can no longer provide enough power to meet the demand, or in other cases such as when the battery state of charge (SOC) drops below a certain level, the engine should start quickly and smoothly in a manner that is nearly transparent to the driver.

SUMMARY

A vehicle includes a battery pack and at least one controller programmed to implement a model of the battery pack. The model includes parameters representing an internal resistance and charge transfer impedance of the battery pack. The parameters are identified by an extended Kalman filter having an augmented state vector with factors introduced to improve observability of the parameters. The factors include a time constant associated with the charge transfer impedance and a variable representing a proportionality between the internal resistance and a resistance term of the charge transfer impedance. The at least one controller is further programmed to operate the battery pack in accordance with the parameters.

A method includes charging and discharging a battery pack based on parameters representing an internal resistance and charge transfer impedance of the battery pack. The parameters are identified by an extended Kalman filter having an augmented state vector partially defined by a time constant associated with the charge transfer impedance and a variable representing a proportionality between the internal resistance and a resistance term of the charge transfer impedance to reduce observed variability of the parameters.

A traction battery system includes a battery pack having one or more cells and at least one controller programmed to implement a model of the one or more cells. The model has parameters identified by a filter at least partially defined by a variable representing a proportionality between an internal resistance of the one or more cells and a resistance term of a charge transfer impedance of the one or more cells to reduce observed variability of the parameters. The at least one controller is further programmed to control the one or more cells in accordance with the parameters.

DETAILED DESCRIPTION

As required, detailed embodiments of the present invention are disclosed herein; however, it is to be understood that the disclosed embodiments are merely exemplary of the invention that may be embodied in various and alternative forms. The figures are not necessarily to scale; some features may be exaggerated or minimized to show details of particular components. Therefore, specific structural and functional details disclosed herein are not to be interpreted as limiting, but merely as a representative basis for teaching one skilled in the art to variously employ the present invention.

An HEV battery system may implement a battery management strategy that estimates values descriptive of the present operating condition of the battery pack and/or one or more battery cells. The battery pack and/or one or more cell operating conditions include battery state of charge, power fade, capacity fade, and instantaneous available power. The battery management strategy may be capable of estimating values as cells age over the lifetime of the pack. The precise estimation of some parameters may improve performance and robustness, and may ultimately lengthen the useful lifetime of the battery pack. For the battery system described herein, estimation of some battery pack and/or cell parameters can be realized as discussed below.

Figure 1:
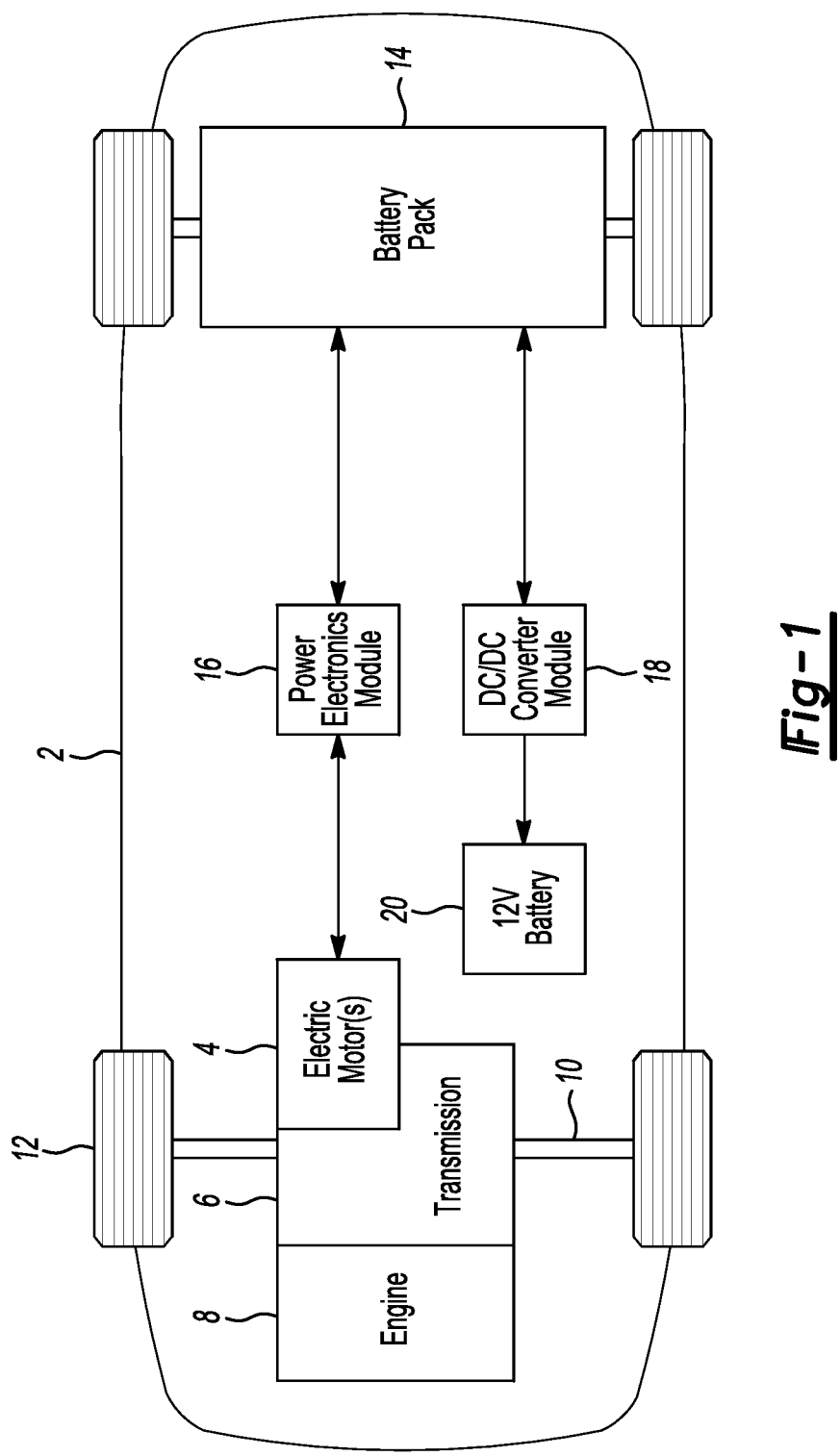
FIG. 1 is a diagram of a hybrid-electric vehicle illustrating typical drivetrain and energy storage components.

FIG. 1 depicts a typical hybrid-electric vehicle. A typical hybrid-electric vehicle 2 may comprise one or more electric motors 4 mechanically connected to a hybrid transmission 6. In addition, the hybrid transmission 6 is mechanically connected to an engine 8. The hybrid transmission 6 is also mechanically connected to a drive shaft 10 that is mechanically connected to the wheels 12. In another embodiment not depicted in the illustration, the hybrid transmission may be a non-selectable gear transmission that may include at least one electric machine. The electric motors 4 can provide propulsion and deceleration capability when the engine 8 is turned on or off. The electric motors 4 also act as generators and can provide fuel economy benefits by recovering energy that would normally be lost as heat in the friction braking system. The electric motors 4 may also provide reduced pollutant emissions since the hybrid electric vehicle 2 may be operated in electric mode under certain conditions.

The battery pack 14 may include one or more battery cells that store energy which can be used by the electric motors 4. A vehicle battery pack 14 typically provides a high voltage DC output. The battery pack 14 is electrically connected to the power electronics module 16. The power electronics module may include one or more control modules that make up a vehicle computing system. The vehicle computing system may control several vehicle features, systems, and/or subsystems. The one or more modules may include, but are not limited to, a battery management system. The power electronics module 16 is also electrically connected to the electric motors 4 and provides the ability to bi-directionally transfer energy between the battery pack 14 and the electric motors 4. For example, a typical battery pack 14 may provide a DC voltage while the electric motors 4 may require a three-phase AC current to function. The power electronics module 16 may convert the DC voltage to a three-phase AC current as required by the electric motors 4. In a regenerative mode, the power electronics module 16 will convert the three-phase AC current from the electric motors 4 acting as generators to the DC voltage required by the battery pack 14.

In addition to providing energy for propulsion, the battery pack 14 may provide energy for other vehicle electrical systems. A typical system may include a DC/DC converter module 18 that converts the high voltage DC output of the battery pack 14 to a low voltage DC supply that is compatible with other vehicle loads. Other high voltage loads may be connected directly without the use of a DC/DC converter module 18. In a typical vehicle, the low voltage systems are electrically connected to a 12V battery 20.

The battery pack 14 may be controlled by the vehicle computing system using one or more control modules. The one or more control modules may include, but are not limited to, a battery control module. The one or more control modules may be calibrated to control the battery pack 14 using battery model parameter estimation methods which include, but are not limited to, an average sense of effective battery internal resistance during operation to determine battery power capability. The power capability prediction enables the battery pack 14 to prevent over-charging and over-discharging, which could lead to reducing the life of the battery, performance issues with the vehicle powertrain, and/or battery degradation.

A vehicle battery measurement method/algorithm may be implemented to eliminate the need of extensive offline testing. The vehicle battery measurement method may use one or more simple equivalent circuits to measure the battery pack in the vehicle to obtain the electrochemical impedance during operation.

Figure 2:
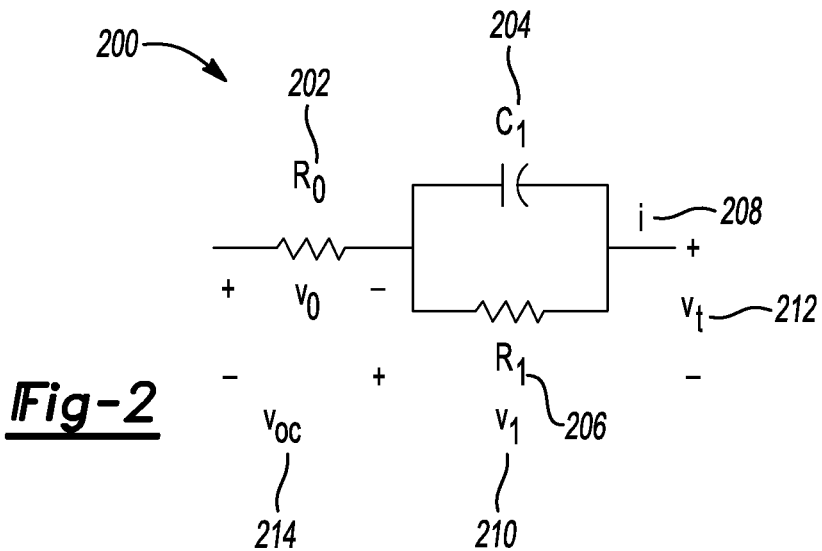
FIG. 2 is a schematic of a simple equivalent circuit to model a Li-ion battery.

FIG. 2 is a schematic of a simple equivalent circuit of a Li-ion battery. The simple equivalent circuit model 200 includes, in this example, a Randles Circuit Model, and/or at least one R-C circuit. The Randles circuit (and/or R-C circuit) consists of an active electrolyte resistance $R_0$ 202, in series with the parallel capacitance $C_1$ 204 and an active charge transfer resistance $R_1$ 206. The Randles circuit may be implemented in a HEV battery management system to provide predictive computations for battery parameters.

The HEV battery management system may implement the Randles Circuit Model using an Extended Kalman Filter to estimate the battery parameters. The battery parameters may include, but are not limited to, battery resistance, capacitance, and/or other state(s) of a battery model. The estimated battery parameters may include fluctuating trajectories which increase when the vehicle is in certain system modes including battery charging, battery sustaining charge, or battery depleting charge. These battery parameters tend to be sensitive to internal and external noise and environmental conditions when using a Randles circuit to estimate these parameters.

A system may eliminate fluctuating trajectories of the one or more battery parameters by using a dynamic model which relates the model resistance parameters together and sets the system time constant as an independent variable for the system identification. The system observability is a measure of how well internal states can be inferred by only using external system outputs. The observability, however, may be improved and the estimated parameter(s) may be less sensitive to the noise(s) with the use of a dynamic model.

A battery management system and method may be based on a Randles Circuit Model to provide improved observability of the system and subsequent robustness in a battery parameter estimation method without increasing the system complexity. The equivalent circuit model 200 may allow the calculation of predictive battery system parameters. The Randles Circuit Model is represented by the following equation:

$$\dot{v}_1 = -\frac{1}{R_1 C_1} v_1 + \frac{1}{C_1} i \quad (1)$$

where $v_1$ 210 is the voltage of the R-C circuit, which consists of $R_1$ 206 and $C_1$ 204 as a function of time, i 208 is the current exciting the circuit, and $R_1$ 206 and $C_1$ 204 represent battery dynamics changing during vehicle operation as indicated in FIG. 2. The equivalent circuit model may allow the calculation of the battery terminal voltage using the following equation:

$$v_t = v_{OC} - v_1 - R_0 i \quad (2)$$

where $v_t$ 212 is the terminal voltage, $v_{OC}$ 214 is the battery open circuit voltage, and $R_0$ 202 is the internal battery resistance. The battery system dynamic control used to calculate/predict/estimate battery parameters may include a function of material properties form the electrochemical battery models. Therefore, each parameter may be related with the relations shown in the following equations:

$$R_1 = k_1 R_0 \quad (3)$$

$$\tau_1 = R_1 C_1 = k_1 R_0 C_1 \quad (4)$$

where $k_1$ is the introduced parameter identified in real-time during vehicle operation and $\tau_1$ is the dynamic respondent of the circuit in real-time. The parameter $k_1$ is a quotient of the internal resistance $R_0$ and a resistance term of the charge transfer impedance $R_1$. The parameter $\tau_1$ is a time constant associated with the charge transfer impedance to reduce observed variability of the parameters. Based on equations (3) and (4), the following equation is derived from equation (1):

$$\dot{v}_1 = -\frac{1}{\tau_1} v_1 + \frac{k_1 R_0}{\tau_1} i \quad (5a)$$

where $v_1$ 210 is the voltage across the R-C circuit as a function of time at time index $k_1$ representing a dynamic respondent of the circuit. Therefore, the following variables are set at time index k:

$$\dot{v}_1 = \frac{v_{1,k+1} - v_{1,k}}{\Delta t} \quad (5b)$$

$$v_1 = v_{1,k}, \text{ and} \quad (5c)$$

$$i = i_k \quad (5d)$$

Having the variables set at a time index enables equation (5a) to be rearranged as follows:

$$v_{1,k+1} = \left(1 - \frac{\Delta t}{\tau_1}\right) v_{1,k} + \frac{k_1 R_0 \Delta t}{\tau_1} i_k \quad (6)$$

$$y_k = v_{OC,k} - v_{t,k} - R_0 i_k = v_{1,k} \quad (7)$$

where $y_k$ is the voltage across the R-C circuit. The model parameter $R_0$ and introduced model parameters $k_1$ and $\tau_1$ augment the state variable $v_1$ 210. Therefore, an augmented state vector is shown in the following equation:

$$X = [v_1 R_0 k_1 \tau_1]^T \qquad (8)$$

The augmented state vector is not limited to the parameters of battery dynamic response $v_1$ and other model parameters characterizing battery dynamics $R_0$, $k_1$, and $\tau_1$ disclosed in equation (8). For example, if an equivalent circuit model includes additional R-C circuits and/or the battery model has other forms of battery dynamic representation, the one or more augmented state vector parameters may change.

A new expression of equation (8) using the augmented state vector X is show in the following Jacobian matrix equation:

$$\begin{bmatrix} v_{1,k+1} \\ R_{0,k+1} \\ k_{1,k+1} \\ \tau_{1,k+1} \end{bmatrix} = F_k \begin{bmatrix} v_{1,k} \\ R_{0,k} \\ k_{1,k} \\ \tau_{1,k} \end{bmatrix} + \begin{bmatrix} \frac{k_1 R_0}{\tau_1} \\ 0 \\ 0 \\ 0 \end{bmatrix} i_k \qquad (9a)$$

where $F_k$ is the system matrix to describe system dynamics and model parameter changes.

A new expression of equation (7) using the augmented state vector X is shown in the following equation:

$$y_k = H_k \begin{bmatrix} v_{1,k} \\ R_{0,k} \\ k_{1,k} \\ \tau_{1,k} \end{bmatrix} \qquad (9b)$$

where $H_k$ is the output matrix for calculating a system response. For example, this output matrix may calculate the battery terminal voltage $v_t$ as the estimated system response in real-time. The system matrix $F_k$ and the output matrix $H_k$ are expressed in the following equations:

$$F_k = \begin{bmatrix} 1 - \frac{\Delta t}{\tau_1} & \frac{k_1 \Delta t}{\tau_1} i_k & \frac{R_0 \Delta t}{\tau_1} i_k & \frac{\Delta t}{\tau_1^2}(v_{1,k} - k_1 R_0 i_k) \\ 0 & 1 & 0 & 0 \\ 0 & 0 & 1 & 0 \\ 0 & 0 & 0 & 1 \end{bmatrix} \qquad (10a)$$

$$H_k = [\, 1 \quad i_k \quad 0 \quad 0 \,] \qquad (10b)$$

The model parameters are used to predict the voltage response when a constant current (i) is applied during time (t) as shown in the following equations:

$$v_1 = v_{1,0} e^{-\frac{1}{R_1 C_1} t} + \left(1 - e^{-\frac{1}{R_1 C_1} t}\right) R_1 i \qquad (11)$$

$$v_t = v_{OC} - v_{1,0} e^{-\frac{1}{R_1 C_1} t} - \left(R_0 + \left(1 - e^{-\frac{1}{R_1 C_1} t}\right) R_1\right) i \qquad (12)$$

Battery current limits may be computed by the following equation:

$$i_{lim} = \frac{v_{OC} - v_{lim} - v_{1,0} e^{\frac{1}{R_1 C_1} t_d}}{R_0 + R_1 \left(1 - e^{\frac{1}{R_1 C_1} t_d}\right)} \qquad (13)$$

Battery power capability $P_{cap}$ may be computed by the following equation:

$$P_{cap} = |i_{lim}| v_{lim} \qquad (14)$$

where $v_{lim}$ in equation (13) and equation (14) is the lower limit voltage of the battery terminal voltage under discharging, and $v_{lim}$ in equation (13) and equation (14) is the upper limit voltage of the battery terminal voltage under charging. For example, during a battery discharge event, the battery discharge current limit during the time period $\Delta t_d$ is calculated from equation (13). Using the calculated battery discharge current limit from equation (13), the battery available power is calculated from equation (14) for the discharge event.

The improved battery parameter calculation method allows for an enhanced estimation of the battery power capability while enabling the reduction of a safety margin for a battery usage so that the battery hardware may be applied more aggressively in the powertrain system. Based on the improved method, the HEV controls become more flexible, thus resulting in improved powertrain performance and efficiency.

Figure 3:
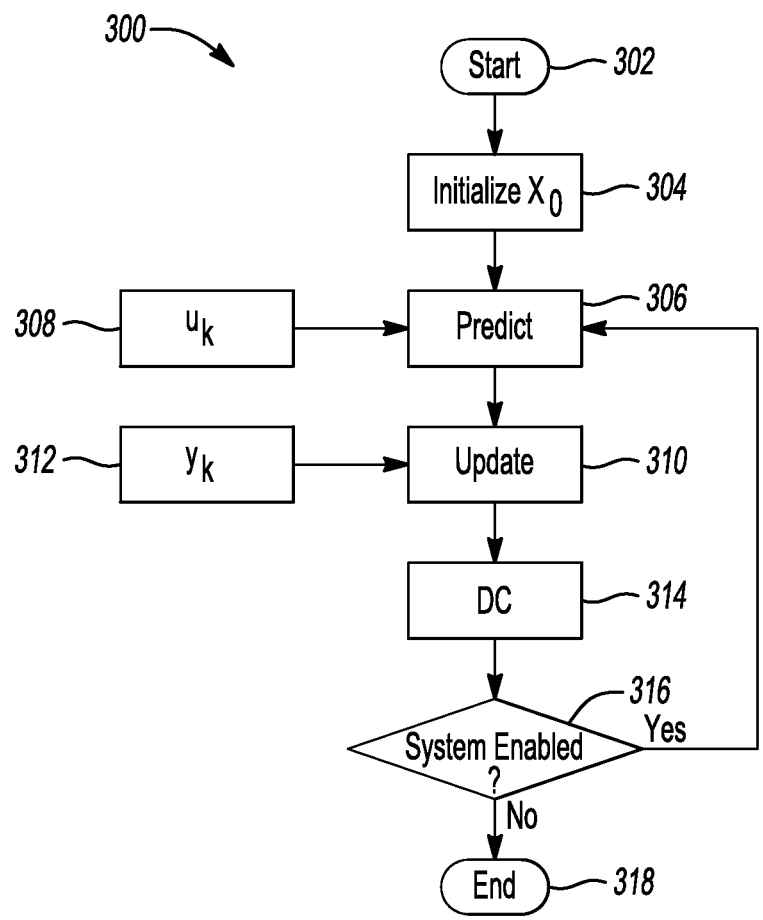
FIG. 3 is a flow chart of an algorithm for identifying one or more battery model parameters used in a battery management method.

FIG. 3 is a flow chart of an algorithm for identifying one or more battery model parameters used in a battery management method. The method may be implemented using software code contained within the vehicle control module. In other embodiments, the method 300 may be implemented in other vehicle controllers, or distributed amongst multiple vehicle controllers.

Referring again to FIG. 3, the vehicle and its components illustrated in FIG. 1 and FIG. 2 are referenced throughout the discussion of the method to facilitate understanding of various aspects of the present disclosure. The method of controlling the battery parameter prediction in the hybrid electric vehicle may be implemented through a computer algorithm, machine executable code, or software instructions programmed into a suitable programmable logic device(s) of the vehicle, such as the vehicle control module, the hybrid control module, other controller in communication with the vehicle computing system, or a combination thereof. Although the various steps shown in the flowchart diagram 300 appear to occur in a chronological sequence, at least some of the steps may occur in a different order, and some steps may be performed concurrently or not at all.

At step 302, during a key-on event which allows the vehicle to be powered on, the vehicle computing system may begin powering up the one or more modules. The powering up of the one or more modules may cause variables related to the battery management system to initialize before enabling one or more algorithms to be executed within the vehicle computing system at step 304.

For example, the battery parameters may need to be initialized during a key-on event due to the dynamics of a battery cell at rest having a self-discharge/charge depletion state. The battery management method may initialize the augmented state vector before predicting and updating the battery terminal voltage, current limits, and/or other battery related parameters to ensure system observability and estimation robustness after the battery pack experiences a charge depletion state. The battery charge depletion state may vary based on several factors including length of vehicle power down without charge, life of the battery, and/or environmental conditions.

At step 306, once the battery management system has initialized the one or more parameters, the system may predict the battery power capability. Predicting the battery power capability allows the system to determine how much power the vehicle computing system may distract from the battery at that moment. Using an accurate predicting algorithm improves the life of the battery, performance of the powertrain system, and the performance of other systems/subsystem powered by the battery pack in the battery electric and/or hybrid electric vehicle.

The predicting equation for the battery management system may include the Extended Kalman Filter with the use of the introduced parameters as presented in the equations above. The model based equation is as follows:

$$\hat{x}_{k|k-1} = f(\hat{x}_{k-1|k-1}, u_{k-1}) \quad (15)$$

where $\hat{x}_{k-1|k-1}$ is the augmented state vector, $u_{k-1}$ is the input current, and f is a nonlinear function representing system dynamics.

At step 308, the input current $u_k$ is transmitted to the algorithm at the specific operating point to allow the system to predict the battery parameters at that time variant. The model parameters are used to predict the voltage response when a constant current is applied during a time period. Based on the equations above, and Extend Kalman Filter (EKF) known variables, the updated filter equation may now predict the next state of the battery power capabilities using the equations as follows:

$$F_{k-1} = \frac{\partial f}{\partial x}\bigg|_{\hat{x}_{k-1|k-1}, u_{k-1}} \quad (16a)$$

$$P_{k|k} = \text{cov}(x_k - \hat{x}_{k|k}) = E\big((x_k - \hat{x}_{k|k})(x_k - \hat{x}_{k|k})^T\big) \quad (16b)$$

$$P_{k|k-1} = \text{cov}(x_k - \hat{x}_{k|k-1}) = E\big((x_k - \hat{x}_{k|k-1})(x_k - \hat{x}_{k|k-1})^T\big) \quad (16c)$$

$$P_{k|k-1} = F_{k-1} P_{k-1|k-1} F_{k-1}^T + Q_k \quad (17)$$

where (16a) is a Jacobian matrix derived from the function of f, k−1 is the time at which the Jacobian matrix is computed, P is a covariance matrix of the state estimation error, and $F_{k-1}$ includes the new parameters that have a physical relationship between the battery parameters and the system dynamics.

At step 310, after the battery management system has predicted the battery power capability, the system may update the battery management system with the new battery measurement value. The new measurement value is based on the predicted battery power capability and the following equation:

$$\tilde{y}_k = y_k - h(\hat{x}_{k|k-1}) \quad (18)$$

where $h(\hat{x}_{k|k-1})$ is the estimation of the measurement in the step 310. The $y_k$ measurement of the battery system is received and transmitted for use in the updating of the new battery measurement predicted value at step 312.

The following equation is the intermediate to determine the Kalman gain $K_k$:

$$S_k = H_k P_{k|k-1} H_k^T + R_k \quad (19)$$

The equation used to determine the Kalman gain $K_k$ is as follows:

$$K_k = P_{k|k-1} H_k^T S_k^{-1} \quad (20)$$

where the Kalman gain determines update state vector $\hat{x}_{k|k}$ from the $K_k \tilde{y}$ as follows:

$$\hat{x}_{k|k} = \hat{x}_{k|k-1} + K_k \tilde{y}_k \quad (21)$$

The covariance of a state estimation error is in the following equation:

$$P_{k|k} = (I - K_k H_k) P_{k|k-1} \quad (22)$$

At step 314, the system may receive the augmented state vector of the battery pack and/or cell based on the predicted and updated Kalman equations, and may compute the voltage response of the battery model. The augmented state vector is partially defined by a variable representing proportionality between the internal resistance and a resistance term of the charge transfer impedance. If the battery management system is enabled, for example the vehicle is still in a key-on state, then the system may continue to use the updated Kalman filter with the introduced variables to predict and update the power capabilities of the battery in real-time at step 316.

At step 318, if the system detects a key-off event which may disable power to the vehicle computing system, the system may end the one or more algorithms used to manage the battery pack and/or the one or more battery cells. The vehicle computing system may have a vehicle key-off mode to allow the system to store one or more parameters in non-volatile memory such that these parameters may be used by the system for the next key-on event.

Figure 4:
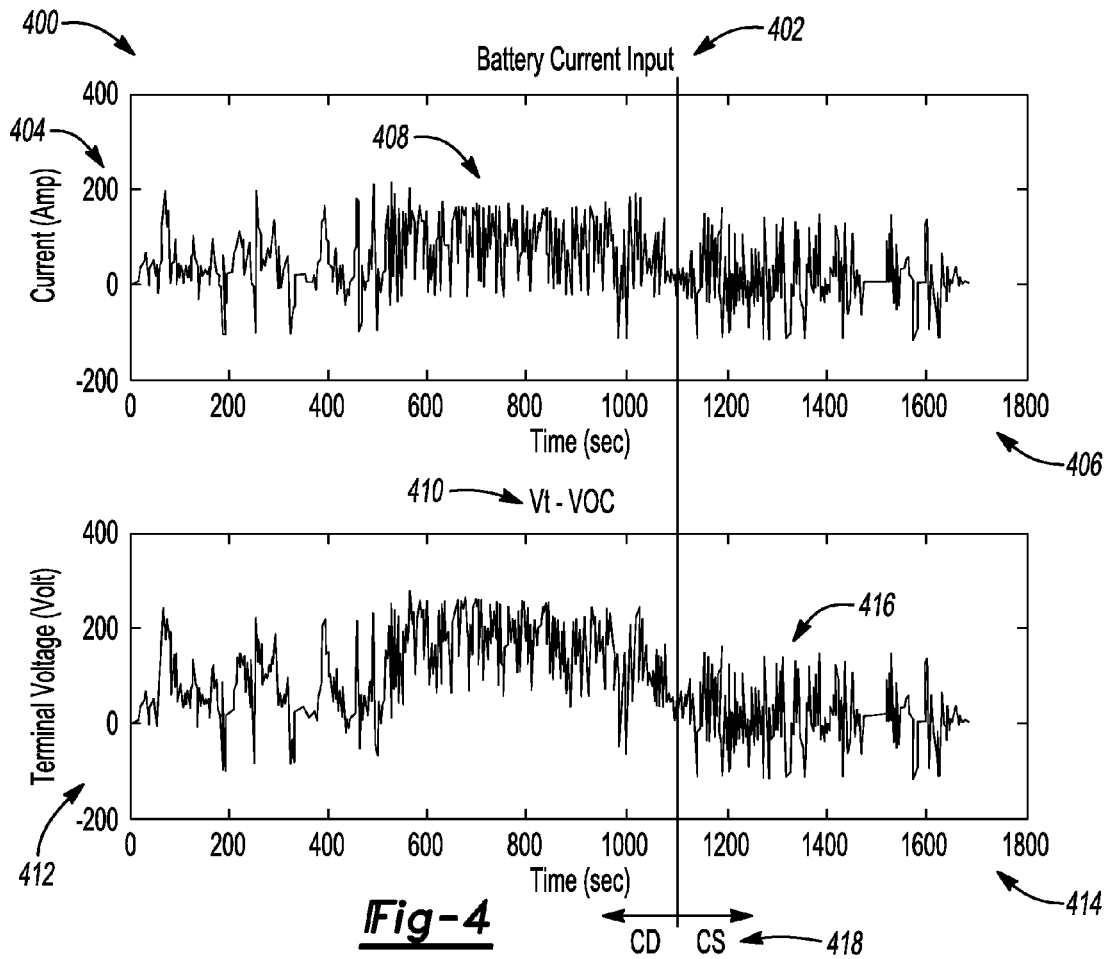
FIG. 4 is graphs displaying a battery current input profile and a voltage output profile measured in a vehicle or by a battery test.

FIG. 4 are graphs 400 displaying a battery current input profile and a voltage output profile measured in a vehicle or by a battery test. The battery current input 402 graph has an x-axis representing time 406 and a y-axis representing current 404. The current input 408 of the battery pack fluctuates based on vehicle driving modes 418 including the transition between charge depleting (CD) and charge sustaining (CS) driving modes of the system.

The voltage output profile is depicted by the terminal voltage 410 graph having an x-axis representing time 414 and a y-axis representing voltage 412. The terminal voltage is the internal battery voltage 416 of the battery pack and fluctuates based on vehicle driving modes 418 including the transition between charge depleting (CD) and charge sustaining (CS) driving modes of the system.

The battery current input graph and the voltage output graph measured in a vehicle or by a battery test demonstrates the fluctuating of the battery system parameters. The fluctuating parameters may cause inaccurate calculations related to battery performance, hybrid powertrain functionality, and/or other systems being powered by the battery.

Figure 5:
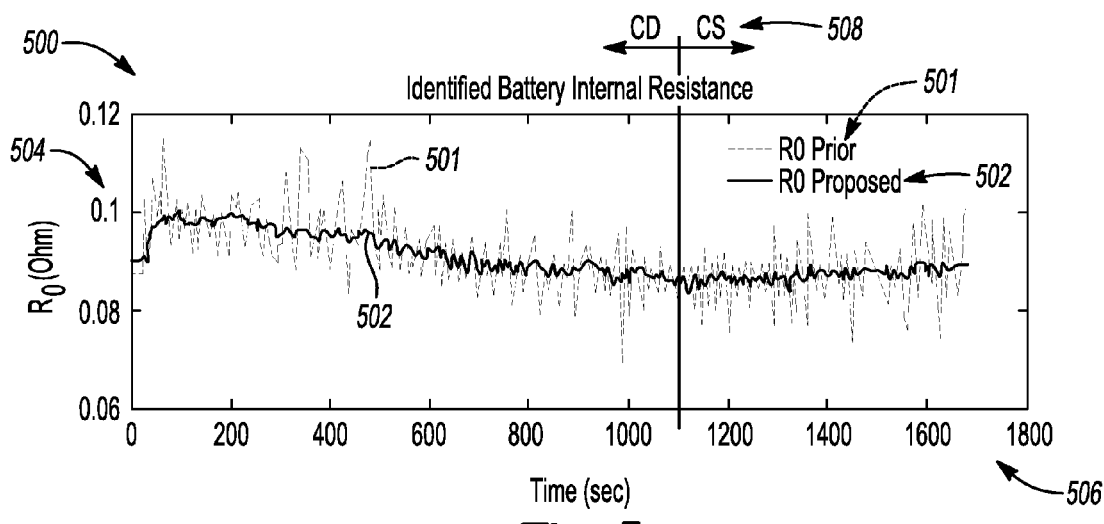
FIG. 5 is a graph displaying a comparison of identified internal battery resistance.

FIG. 5 is a graph 500 displaying a comparison of calculated battery resistance based on identified battery model parameters. Previous approaches using EKF to measure battery voltage and/or current were implemented in a battery management system; however, the predicted battery parameters tend to show a somewhat fluctuating trajectory. For example, in a hybrid electric vehicle the battery parameters tend to show fluctuating trajectory when the vehicle driving modes are changing between charge depleting and charge sustaining modes 508.

The previous approach of using the EKF to estimate battery parameters in a battery management system tend to be sensitive to internal and external noise caused by the weak observability of the Randle circuit parameters. The Randle circuit parameters using the previous EKF approach has weak electrochemical relationship between each parameter.

For example, the previous estimation of internal resistance $R_0$ 501 of the battery pack and/or cell is shown on the graph 500 in FIG. 5 as weakly observable by a vehicle system or a battery test. The estimation of internal resistance 501 of the battery pack/cell is represented by the graph having an x-axis representing time 506 and a y-axis representing ohms 504. The graph demonstrates the sensitivity to the measurement when the vehicle driving modes are transitioning between battery charge depleting and battery charge sustaining modes 508.

The $R_O$ 502 estimated by the proposed algorithm using EKF with the introduced variables of the battery pack and/or cell is shown on the graph in FIG. 5. The proposed estimation of internal resistance 502 illustrates an improvement to system observability and estimation compared to the previous approach. The proposed estimation of internal resistance $R_O$ 502 eliminates the noise by tracking the varying time constant depending on the driving mode changes from CD to CS 508 efficiently. As explained above, by relating the model resistance parameters together and setting the system time constant as an independent variable for the system identification, the parameters may be less sensitive to the noise.

Figure 6:
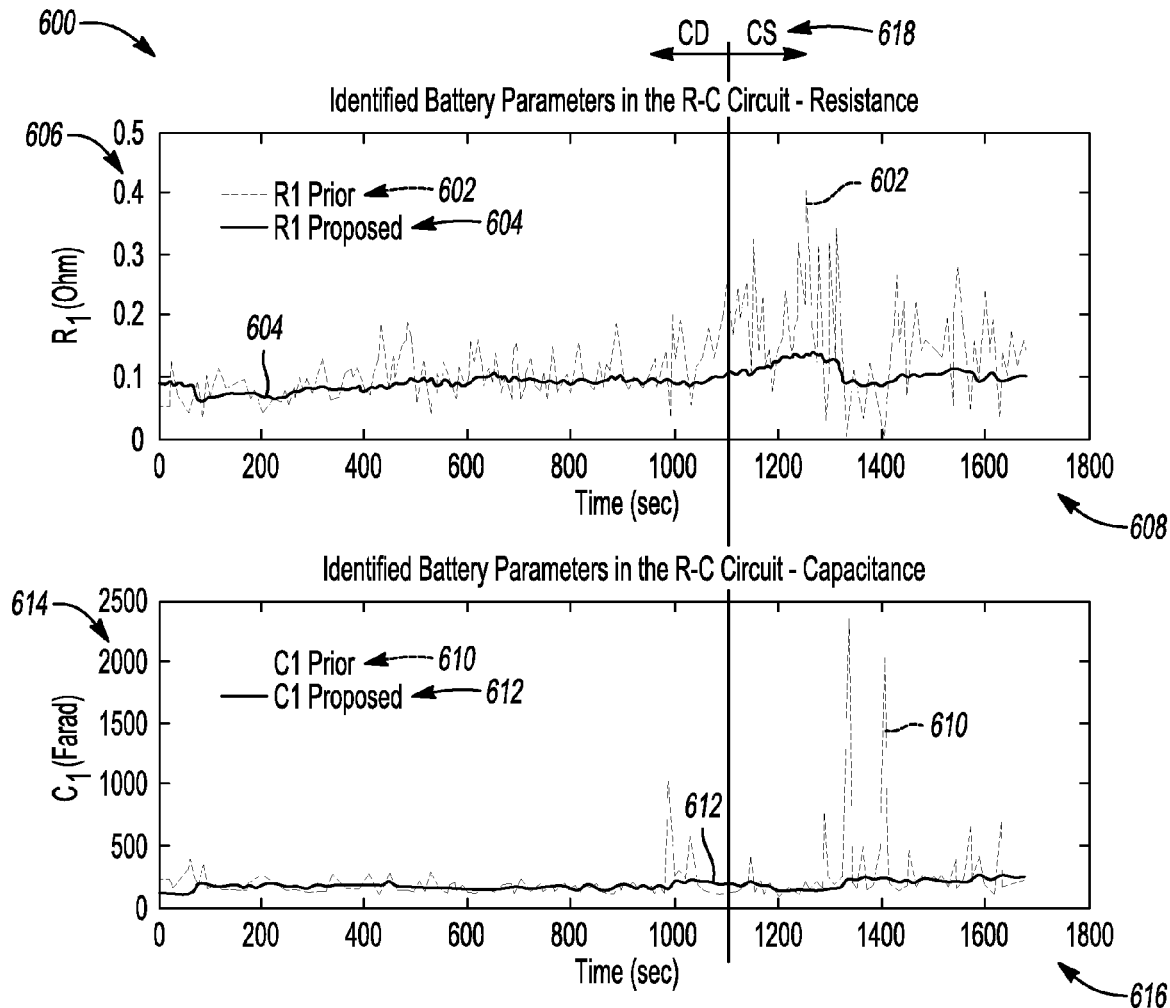
FIG. 6 is graphs displaying a comparison of identified battery model parameters in the R-C circuit.

FIG. 6 are graphs displaying a comparison of the estimated battery model parameters in the R-C circuit of the battery equivalent circuit model. The graphs 600 represents a resistance term of the charge transfer impedance, represented by the R-C circuit, of the battery management system. The prior estimation values are compared to the proposed estimation values as depicted in the graphs to illustrate the improvement in the observability of the battery parameters using the adjusted EKF method.

The previous estimation of the resistance term of the charge transfer impedance represented by the R-C circuit is depicted in the graph having an x-axis representing time 608 and a y-axis representing ohms 606. The previous estimation of the resistance term of the charge transfer impedance $R_1$ 602 in a battery management system fluctuates based on the sensitivity to internal and external noise of the Randal circuit. The proposed estimation of the resistance term of the charge transfer impedance $R_1$ 604 eliminates the noise by relating the model resistance parameters together and setting the system time constant as an independent variable for the system identification.

For example, under the previous estimation of resistance term of the charge transfer impedance 602, the system would have a fluctuating trajectory when the vehicle driving modes transitions between the CD to CS 618. Under the proposed estimation of resistance term of the charge transfer impedance 604 based on the adjusted EKF method, the estimation is improved and has significantly eliminated the sensitivity to the noise in the system.

The capacitance term of the charge transfer impedance by $C_1$ determines battery dynamics changing during vehicle operation. The previous estimation of battery dynamics 610 during vehicle operation is illustrated by fluctuating trajectory in which the x-axis is time 616 and the y-axis is farad 614. The proposed estimation of battery dynamics 612 is illustrated as a significantly improved measurement calculation of the battery system.

An accurate battery parameter estimation method for the battery management system provides performance, reliability, density in design of battery packs/cells, and/or economy by having smaller battery systems. The accurate battery parameter estimation method may include an adjusted state vector in the EKF method that improves battery control related to operating conditions including, but not limited to, state of charge, power fade, capacity fade, and instantaneous available power. The estimation method of battery parameters may ultimately lengthen the useful lifetime of the battery system.

While exemplary embodiments are described above, it is not intended that these embodiments describe all possible forms of the invention. Rather, the words used in the specification are words of description rather than limitation, and it is understood that various changes may be made without departing from the spirit and scope of the invention. Additionally, the features of various implementing embodiments may be combined to form further embodiments of the invention.

What is claimed is:

1. A vehicle comprising:
a battery pack; and
at least one controller programmed to
implement a model of the battery pack having parameters (i) representing an internal resistance and charge transfer impedance of the battery pack and (ii) identified from an extended Kalman filter having an augmented state vector at least partially defined by a time constant associated with the charge transfer impedance and a variable representing a quotient of a proportionality between the internal resistance and a resistance term of the charge transfer impedance to reduce observed variability of the parameters; and
control the battery pack in accordance with the parameters.

2. The vehicle of claim 1, wherein the charge transfer impedance is associated with at least one R-C circuit representation of the battery pack.

3. The vehicle of claim 1, wherein the at least one controller is further programmed to apply the augmented state vector to Jacobian matrices describing changes in battery parameter values of the model.

4. The vehicle of claim 1, wherein the augmented state vector further includes additional state variables representing battery dynamic responses or model parameters characterizing battery dynamics.

5. The vehicle of claim 1, wherein the at least one controller is further programmed to output power capability for a given time period based on the parameters.

6. A method comprising:
charging and discharging a battery pack based on parameters (i) representing an internal resistance and charge transfer impedance of the battery pack and (ii) identified from an extended Kalman filter having an augmented state vector partially defined by a time constant associated with the charge transfer impedance and a variable representing a quotient of a proportionality between the internal resistance and a resistance term of the charge transfer impedance reducing parameter variability.

7. The method of claim 6, wherein the charge transfer impedance is associated with at least one R-C circuit representation of the battery pack.

8. The method of claim 6, wherein the augmented state vector is applied to Jacobian matrices describing changes in battery parameter values of a dynamic model.

9. The method of claim 6, wherein the augmented state vector further includes additional state variables representing battery dynamic responses or model parameters characterizing battery dynamics.

10. A traction battery system comprising:
a battery pack having one or more cells;
at least one controller programmed to implement a model of the one or more cells having parameters identified by a filter at least partially defined by a variable representing a quotient of a proportionality between an internal resistance of the one of more cells and a resistance term of a charge transfer impedance of the one or more cells to reduce observed variability of the parameters; and control the one or more cells in accordance with the parameters.

11. The system of claim 10, wherein the filter is further defined by a time constant associated with the charge transfer impedance.

12. The system of claim 10, wherein the charge transfer impedance is associated with at least one R-C circuit representation of the battery pack.

* * * * *